US012751301B2

United States Patent
(12) United States Patent
Kim

(10) Patent No.: US 12,751,301 B2
(45) Date of Patent: Sep. 29, 2026

(54) MINIATURIZED HIGH-CAPACITY SEMICONDUCTOR PACKAGE

(71) Applicant: SAMSUNG ELECTRONICS CO., LTD., Suwon-si (KR)

(72) Inventor: Hye Jin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 638 days.

(21) Appl. No.: 17/806,985

(22) Filed: Jun. 15, 2022

(65) Prior Publication Data

US 2023/0134201 A1 May 4, 2023

(30) Foreign Application Priority Data

Oct. 28, 2021 (KR) ........................ 10-2021-0145562

(51) Int. Cl.
*H10W 70/65* (2026.01)
*H10W 70/60* (2026.01)
(Continued)

(52) U.S. Cl.
CPC .......... *H10W 70/65* (2026.01); *H10W 70/611* (2026.01); *H10W 70/685* (2026.01);
(Continued)

(58) Field of Classification Search
CPC ......... H01L 23/49838; H01L 23/49822; H01L 23/5385; H01L 24/16; H01L 25/105;
(Continued)

(56) References Cited

U.S. PATENT DOCUMENTS 7,993,972 B2 * 8/2011 Lin ........................ H01L 24/73 438/109
8,859,912 B2 10/2014 Tseng et al.
(Continued)

FOREIGN PATENT DOCUMENTS

JP 2015-154055 8/2015
JP 2017-017307 1/2017
(Continued)

OTHER PUBLICATIONS

Office Action dated Jun. 9, 2025 issued in corresponding Korean Patent Application No. 10-2021-0145562. (Note: US2020/0176384A already submitted.).

*Primary Examiner* — Eliseo Ramos Feliciano
*Assistant Examiner* — Timothy Edward Duren
(74) *Attorney, Agent, or Firm* — MORGAN, LEWIS & BOCKIUS LLP

(57) ABSTRACT

A semiconductor package includes a substrate including a first wiring pattern, a redistribution layer disposed on an upper surface of the substrate, a solder resist layer disposed on an upper surface of the redistribution layer and including a second recess formed inside the solder resist layer, a first conductive terminal disposed on sidewalls and a bottom surface of the second recess, a first solder ball disposed on the first conductive terminal, and a semiconductor chip disposed on the solder resist layer and electrically directly connected to the redistribution layer through the first solder ball. The redistribution layer includes a first wiring pad, a first recess formed on an upper surface of the first wiring pad, a first metal seed layer disposed on sidewalls and a bottom surface of the first recess, and a first wiring post at least partially disposed on the first metal seed layer inside the first recess.

16 Claims, 12 Drawing Sheets

(51) Int. Cl.

| | |
|---|---|
| ***H10W 70/685*** | (2026.01) |
| ***H10W 72/00*** | (2026.01) |
| ***H10W 72/20*** | (2026.01) |
| ***H10W 90/00*** | (2026.01) |

(52) U.S. Cl.
CPC ......... *H10W 90/00* (2026.01); *H10W 90/401* (2026.01); *H10W 72/072* (2026.01); *H10W 72/252* (2026.01); *H10W 90/724* (2026.01)

(58) Field of Classification Search
CPC ..................... H01L 24/13; H01L 24/81; H01L 2224/13109; H01L 2224/13111; H01L 2224/13113; H01L 2224/13116; H01L 2224/13118; H01L 2224/1312; H01L 2224/13139; H01L 2224/13144; H01L 2224/13147; H01L 2224/13155; H01L 2224/16227; H01L 2224/81399; H01L 2924/014
See application file for complete search history.

(56) References Cited

U.S. PATENT DOCUMENTS

| | | | | |
|---|---|---|---|---|
| 9,572,256 | B2 | 2/2017 | Yoshikawa et al. | |
| 2008/0080113 | A1 | 4/2008 | Lin et al. | |
| 2019/0027451 | A1 | 1/2019 | Kim et al. | |
| 2019/0088564 | A1* | 3/2019 | Tai | H01L 23/3128 |
| 2019/0131231 | A1* | 5/2019 | Lu | H01L 21/563 |
| 2019/0287928 | A1* | 9/2019 | Lu | H10W 42/121 |
| 2019/0363073 | A1* | 11/2019 | Hong | H01L 23/18 |
| 2020/0075470 | A1* | 3/2020 | Kuo | H01L 23/49866 |
| 2020/0152574 | A1 | 5/2020 | Ding et al. | |
| 2020/0176384 | A1* | 6/2020 | Wu | H10P 72/74 |
| 2021/0111114 | A1 | 4/2021 | Lee et al. | |

FOREIGN PATENT DOCUMENTS

| | | | |
|---|---|---|---|
| KR | 10-2015-0009671 | | 1/2015 |
| KR | 10-2019-0011125 | A | 2/2019 |
| KR | 10-2019-0046214 | | 5/2019 |
| KR | 10-2020-0142730 | | 12/2020 |
| KR | 10-2021-0044556 | A | 4/2021 |

* cited by examiner

MINIATURIZED HIGH-CAPACITY SEMICONDUCTOR PACKAGE

CROSS-REFERENCE TO RELATED APPLICATION

This application claims priority under 35 U.S.C. § 119 to Korean Patent Application No. 10-2021-0145562, filed on Oct. 28, 2021 in the Korean Intellectual Property Office, the disclosure of which is incorporated by reference herein in its entirety.

TECHNICAL FIELD

Embodiments of the present disclosure relate to a semiconductor package.

DISCUSSION OF RELATED ART

As advances are made in the implementation of high-performance elements, sizes of semiconductor chips have increased, and as a result, sizes of semiconductor packages have also increased. Meanwhile, the thickness of semiconductor packages has been decreasing in light of the demand for thin electronic devices.

Semiconductor packages are being developed to satisfy the demands for multi-functionality, high capacity, and miniaturization. For this reason, by incorporating a plurality of semiconductor chips into a single semiconductor package, it has become possible to implement high capacity and multi-functional devices, while significantly reducing the size of semiconductor packages used in such devices.

SUMMARY

Embodiments of the present disclosure provide a semiconductor package in which a structural stability between a wiring post and a wiring pad is increased, by disposing at least a part of the wiring post inside a recess formed in the wiring pad, inside a redistribution layer.

According to embodiments of the present disclosure, a semiconductor package includes a first wiring pattern, and a first redistribution layer disposed on an upper surface of the substrate. The first redistribution layer includes a first wiring pad, a first recess formed on an upper surface of the first wiring pad, a first metal seed layer disposed on sidewalls and a bottom surface of the first recess, and a first wiring post at least partially disposed on the first metal seed layer inside the first recess. The semiconductor package further includes a first solder resist layer disposed on an upper surface of the first redistribution layer and including a second recess formed inside the first solder resist layer, a first conductive terminal disposed on sidewalls and a bottom surface of the second recess, a first solder ball disposed on the first conductive terminal, and a first semiconductor chip disposed on the first solder resist layer and electrically directly connected to the first redistribution layer through the first solder ball.

According to embodiments of the present disclosure, a semiconductor package includes a substrate including a first wiring pattern, a wiring pad disposed on an upper surface of the substrate, a first recess recessed from an upper surface of the wiring pad toward the upper surface of the substrate, a metal seed layer disposed on sidewalls and a bottom surface of the first recess, and a wiring post at least partially disposed on the metal seed layer inside the first recess. The wiring post is in contact with the metal seed layer disposed on the sidewalls of the first recess, and the wiring post extends in a vertical direction. The semiconductor package further includes a second wiring pattern disposed on an upper surface of the wiring post. The second wiring pattern is in contact with the wiring post. The semiconductor package further includes a solder resist layer disposed on the second wiring pattern. The upper surface of the wiring post is higher than the upper surface of the wiring pad, and the upper surface of the wiring post is lower than a lower surface of the solder resist layer.

According to embodiments of the present disclosure, a semiconductor package includes a substrate including a first wiring pattern, a wiring pad disposed on an upper surface of the substrate, a first recess recessed from an upper surface of the wiring pad toward the upper surface of the substrate, a metal seed layer disposed along two sidewalls and a bottom surface of the first recess, and a wiring post at least partially disposed on the metal seed layer inside the first recess. The wiring post is in contact with the metal seed layer disposed on the two sidewalls of the first recess, and the wiring post extends in a vertical direction. The semiconductor package further includes a second wiring pattern disposed on an upper surface of the wiring post and in contact with the wiring post, a solder resist layer disposed on the second wiring pattern, a second recess formed inside the solder resist layer, a conductive terminal disposed along sidewalls and a bottom surface of the second recess, a first solder ball disposed on a lower surface of the substrate, a second solder ball disposed on the conductive terminal, and a semiconductor chip disposed on the solder resist layer and electrically directly connected to the second wiring pattern through the second solder ball. The upper surface of the wiring post is higher than the upper surface of the wiring pad, and the upper surface of the wiring post is lower than a lower surface of the solder resist layer.

BRIEF DESCRIPTION OF THE DRAWINGS

The above and other features of the present disclosure will become more apparent by describing in detail embodiments thereof with reference to the accompanying drawings, in which.

DETAILED DESCRIPTION OF THE EMBODIMENTS

Figure 1:
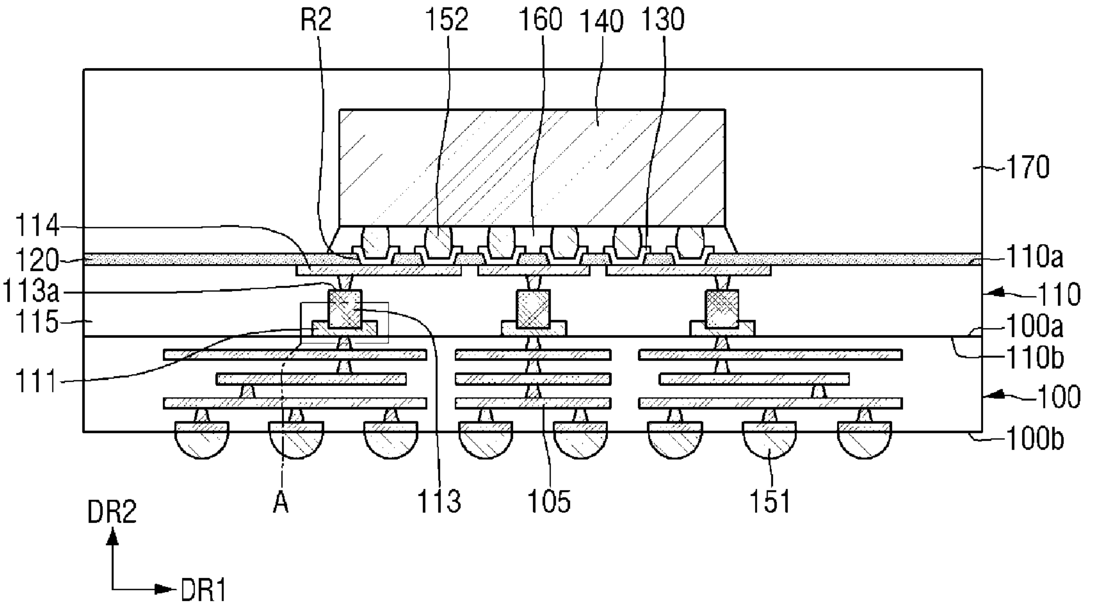
FIG. 1 is a diagram illustrating a semiconductor package according to embodiments of the present disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Hereinafter, a semiconductor package according to embodiments of the present disclosure will be described with reference to FIGS. 1 and 2.

FIG. 1 is a diagram illustrating a semiconductor package according to embodiments of the present disclosure. FIG. 2 is an enlarged view of a region A of FIG. 1 according to embodiments of the present disclosure.

Figure 2:
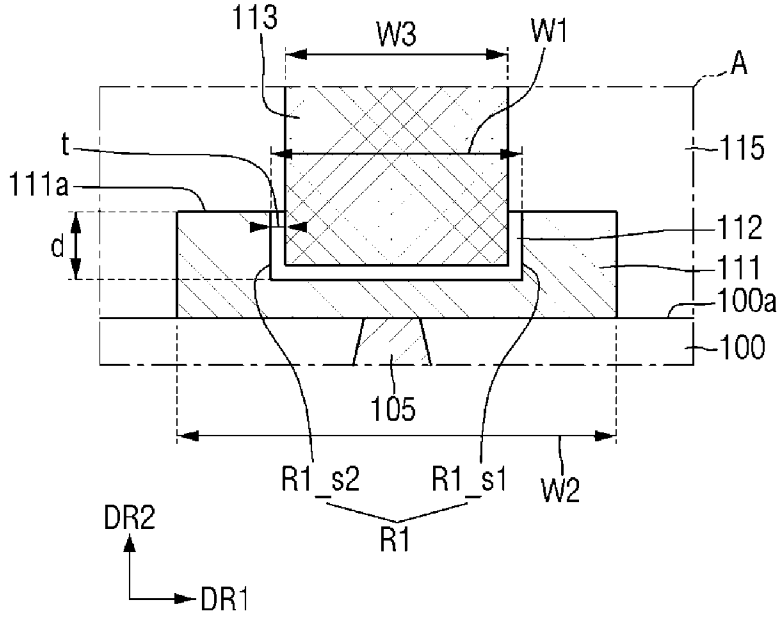
FIG. 2 is an enlarged view of a region A of FIG. 1 according to embodiments of the present disclosure.

Referring to FIGS. 1 and 2, the semiconductor package according to embodiments of the present disclosure includes a substrate 100, a first wiring pattern 105, a first redistribution layer 110, a first solder resist layer 120, a first conductive terminal 130, a first semiconductor chip 140, a first solder ball 151, a second solder ball 152, a first underfill material 160, and a first mold layer 170.

The substrate 100 may be, for example, a printed circuit board (PCB) or a ceramic substrate. However, embodiments of the present disclosure are not limited thereto.

When the substrate 100 is a printed circuit board, the substrate 100 may be made of at least one of, for example, phenol resin, epoxy resin, and polyimide. For example, the substrate 100 may include at least one of FR4, tetrafunctional epoxy, polyphenylene ether, epoxy/polyphenylene oxide, BT (bismaleimide triazine), thermount, cyanate ester, polyimide, and liquid crystal polymer.

The first wiring pattern 105 may be disposed inside the substrate 100. The first wiring pattern 105 may include a plurality of wirings spaced apart from each other in a horizontal direction DR1. Further, the first wiring pattern 105 may include a plurality of wirings spaced apart from each other in a vertical direction DR2. The first wiring pattern 105 may include a conductive material.

The first solder ball 151 may be disposed on a lower surface 100*b* of the substrate 100. The first solder ball 151 may be in contact with the first wiring pattern 105 disposed on the lower surface 100*b* of the substrate 100. The first solder ball 151 may protrude convexly from the lower surface 100*b* of the substrate 100. The first solder ball 151 may be a portion by which the substrate 100 is electrically connected to another external element.

The first solder ball 151 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof. However, embodiments of the present disclosure are not limited thereto.

The first redistribution layer 110 may be disposed on an upper surface 100*a* of the substrate 100. A lower surface 110*b* of the first redistribution layer 110 may be in contact with the upper surface 100*a* of the substrate 100. The first redistribution layer 110 may include a first wiring pad 111, a first metal seed layer 112, a first wiring post 113, a second wiring pattern 114, and a first interlayer insulating film 115.

The first wiring pad 111 may be disposed on the upper surface 100*a* of the substrate 100. The first wiring pad 111 may be in contact with the first wiring pattern 105. For example, the first wiring pad 111 may be directly electrically connected to the first wiring pattern 105. However, embodiments of the present disclosure are not limited thereto. For example, in embodiments, a metal seed layer may be disposed between the upper surface 100*a* of the substrate 100 and the first wiring pad 111. The first wiring pad 111 may include a plurality of pads spaced apart from each other in the horizontal direction DR1.

A width W2 of the first wiring pad 111 in the horizontal direction DR1 may have a range of about 35 μm to about 130 μm. The first wiring pad 111 may include, for example, copper (Cu). In embodiments, the first wiring pad 111 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof.

A first recess R1 may be formed inside the first wiring pad 111. The first recess R1 may be recessed from an upper surface 111*a* of the first wiring pad 111 toward the upper surface 100*a* of the substrate 100. A bottom surface of the first recess R1 may be formed inside the first wiring pad 111.

The first recess R1 may include a first sidewall R1_*s*1, and a second sidewall R1_*s*2 disposed opposite to the first sidewall R1_*s*1 in the horizontal direction DR1. For example, a width W1 of the first recess R1 in the horizontal direction DR1 may have a range of about 20 μm to about 100 μm. Here, the width W1 of the first recess R1 in the horizontal direction DR1 may be defined as a width in the horizontal direction DR1 between the first sidewall R1_*s*1 of the first recess R1 and the second sidewall R1_*s*2 of the first recess R1. For example, the width W1 of the first recess R1 in the horizontal direction DR1 may be formed to be about 80% or less of the width W2 of the first wiring pad 111 in the horizontal direction DR1.

For example, a depth d of the first recess R1 in the vertical direction DR2 may have a range of about 0.5 μm to about 3 μm. The depth d of the first recess R1 in the vertical direction DR2 may be defined as a depth in the vertical direction DR2 from the upper surface 111*a* of the first wiring pad 111 to a bottom surface of the first recess R1.

The first metal seed layer 112 may be disposed along the first sidewall R1_*s*1, the second sidewall R1_*s*2, and the bottom surface of the first recess R1. For example, the first metal seed layer 112 may be conformally formed along the first sidewall R1_*s*1, the second sidewall R1_*s*2, and the bottom surface of the first recess R1. For example, an uppermost surface of the first metal seed layer 112 may be formed on the same plane as the upper surface 111*a* of the first wiring pad 111. For example, a thickness t of the first metal seed layer 112 may have a range of about 0.3 μm to about 3 μm.

The first metal seed layer 112 may include, for example, copper (Cu). In embodiments, the first metal seed layer 112 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof.

For example, the first metal seed layer 112 may include the same material as the first wiring pad 111. For example, each of the first metal seed layer 112 and the first wiring pad 111 may include copper (Cu). In this case, the copper (Cu) included in the first metal seed layer 112 may have a finer structure than the copper (Cu) included in the first wiring pad 111.

The first wiring post 113 may be disposed on the first metal seed layer 112. At least a part of the first wiring post 113 may be disposed inside the first recess R1. The first wiring post 113 may extend in the vertical direction DR2. For example, the first wiring post 113 may extend lengthwise in the vertical direction DR2.

The first wiring post 113 may be in contact with the first metal seed layer 112 disposed on the first sidewall R1_*s*1 of the first recess R1. Further, the first wiring post 113 may be in contact with the first metal seed layer 112 disposed on the second sidewall R1_*s*2 of the first recess R1. The first wiring post 113 may be in contact with the first metal seed layer 112 disposed on the bottom surface of the first recess R1. The first recess R1 may be completely filled by the first metal seed layer 112 and the first wiring post 113.

An upper surface 113*a* of the first wiring post 113 may be formed to be higher than the upper surface 111*a* of the first wiring pad 111. The upper surface 113*a* of the first wiring post 113 may be formed to be lower than the upper surface 110*a* of the first redistribution layer 110. The upper surface 113*a* of the first wiring post 113 may be formed to be lower than the lower surface of the first solder resist layer 120.

A width W3 of the first wiring post 113 in the horizontal direction DR1 may be smaller than the width W2 of the first wiring pad 111 in the horizontal direction DR1. The width W3 of the first wiring post 113 in the horizontal direction DR1 may be smaller than the width W1 of the first recess R1 in the horizontal direction DR1.

The first wiring post 113 may include, for example, copper (Cu). In embodiments, the first wiring post 113 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof.

For example, the first wiring post 113 may include the same material as the first metal seed layer 112. For example, each of the first wiring post 113 and the first metal seed layer 112 may include copper (Cu). In this case, the copper (Cu) included in the first metal seed layer 112 may have a finer structure than the copper (Cu) included in the first wiring post 113.

The second wiring pattern 114 may be disposed on the upper surface of the first wiring post 113. The second wiring pattern 114 may include a plurality of wirings spaced apart from each other in the horizontal direction DR1. Further, the second wiring pattern 114 may include a plurality of wirings spaced apart from each other in the vertical direction DR2. The second wiring pattern 114 may include a conductive material.

The first interlayer insulating film 115 may be disposed on the upper surface 100*a* of the substrate 100. The first interlayer insulating film 115 may surround the first wiring pad 111, the first metal seed layer 112, the first wiring post 113, and the second wiring pattern 114. For example, the upper surface of the first interlayer insulating film 115 may form the upper surface 110*a* of the first redistribution layer 110. For example, the upper surface of the first interlayer insulating film 115 may be formed on the same plane as the uppermost surface of the second wiring pattern 114. The first interlayer insulating film 115 may include an insulating material.

The first solder resist layer 120 may be disposed on the upper surface 110*a* of the first redistribution layer 110. The first solder resist layer 120 may be in contact with each of the upper surface 110*a* of the first redistribution layer 110 and the uppermost surface of the second wiring pattern 114. The first solder resist layer 120 may include, for example, photo solder resist (PSR) ink.

A second recess R2 may be formed inside the first solder resist layer 120. The second recess R2 may extend in the vertical direction DR2 from the upper surface of the first solder resist layer 120 to the lower surface of the first solder resist layer 120. The second wiring pattern 114 may be exposed by the second recess R2.

The first conductive terminal 130 may be disposed along the sidewalls and the bottom surface of the second recess R2. Further, at least a part of the first conductive terminal 130 may be disposed on the upper surface of the first solder resist layer 120 adjacent to both sidewalls of the second recess R2. The first conductive terminal 130 may include a conductive material.

The second solder ball 152 may be disposed on the first conductive terminal 130. The second solder ball 152 may protrude from the first conductive terminal 130 in the vertical direction DR2. The second solder ball 152 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof. However, embodiments of the present disclosure are not limited thereto.

The first semiconductor chip 140 may be disposed on the upper surface of the first solder resist layer 120. The first semiconductor chip 140 may be electrically connected to the second solder ball 152. The first semiconductor chip 140 may be electrically directly connected to the first redistribution layer 110 through the second solder ball 152.

The first underfill material 160 may surround the sidewalls of the second solder ball 152 between the upper surface of the first solder resist layer 120 and the first semiconductor chip 140. The first underfill material 160 may be formed to further protrude laterally from the sidewalls of the first semiconductor chip 140. However, embodiments of the present disclosure are not limited thereto.

The first mold layer 170 may surround the sidewalls of the first underfill material 160, and the sidewalls and the upper surface of the first semiconductor chip 140, on the upper surface of the first solder resist layer 120. However, embodiments of the present disclosure are not limited thereto. For example, in embodiments, the upper surface of the first mold layer 170 may be formed on the same plane as the upper surface of the first semiconductor chip 140. The first mold layer 170 may include, for example, an epoxy molding compound (EMC) or two or more types of silicone hybrid materials. However, embodiments of the present disclosure are not limited thereto.

In the semiconductor package according to embodiments of the present disclosure, because at least a part of the first wiring post 113 is disposed inside the first recess R1 formed in the first wiring pad 111, the structural stability between the first wiring post 113 and the first wiring pad 111 can be increased.

Hereinafter, a method of fabricating a semiconductor package according to embodiments of the present disclosure will be described with reference to FIGS. 1 to 16.

FIGS. 3 to 16 are intermediate process diagrams illustrating a method of fabricating a semiconductor package according to embodiments of the present disclosure.

Figure 3:
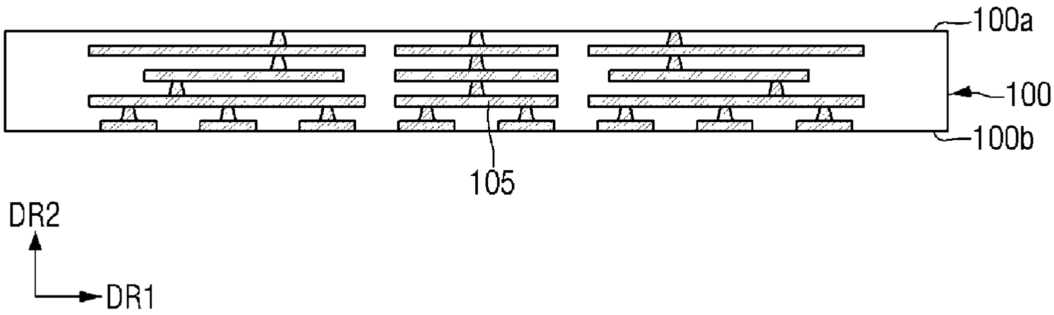
FIGS. 3 to 16 are intermediate process diagrams illustrating a method of fabricating a semiconductor package according to embodiments of the present disclosure.

Referring to FIG. 3, the substrate 100 may be provided. The first wiring pattern 105 may be formed inside the substrate 100. The uppermost surface of the first wiring pattern 105 may be exposed on the upper surface 100*a* of the substrate 100. Further, the lowermost surface of the first wiring pattern 105 may be exposed on the lower surface 100*b* of the substrate 100.

Figure 4:
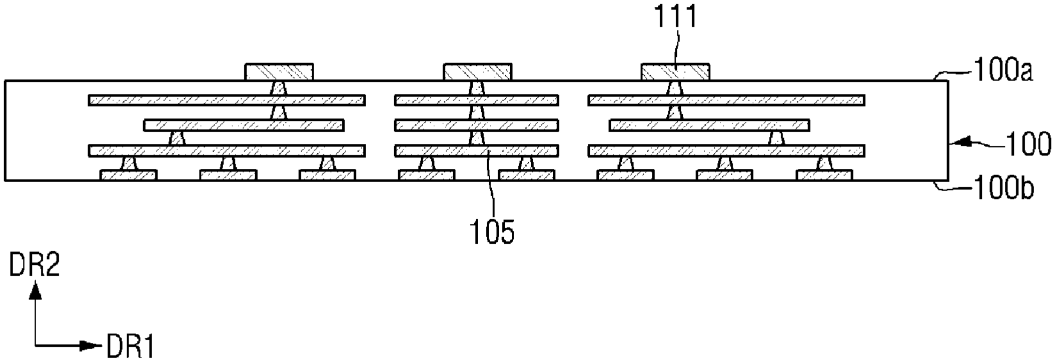

Referring to FIG. 4, the first wiring pad 111 may be formed on the upper surface 100*a* of the substrate 100. The first wiring pad 111 may be formed to be in contact with the first wiring pattern 105 exposed on the upper surface 100*a* of the substrate 100. However, embodiments of the present disclosure are not limited thereto. For example, in embodiments, the first wiring pad 111 may be grown using a metal seed layer formed on the upper surface 100*a* of the substrate 100 as a seed. In this case, a metal seed layer may be formed between the upper surface 100*a* of the substrate 100 and the first wiring pad 111.

Figure 5:
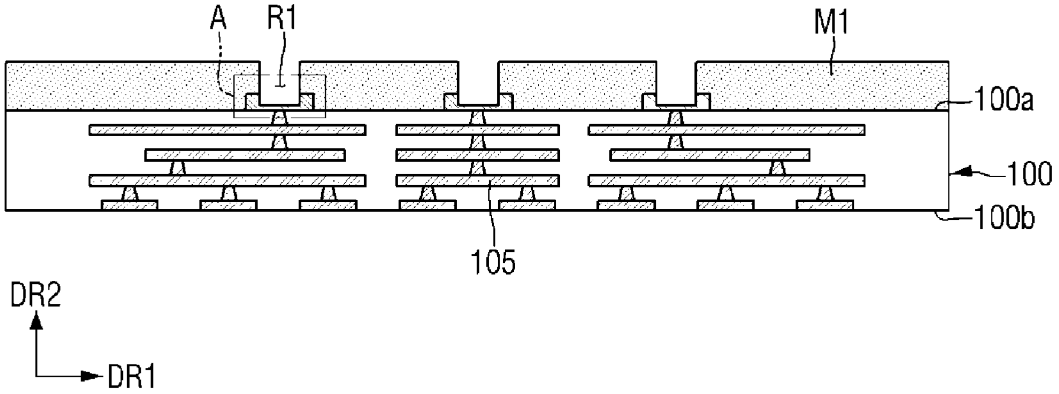
Figure 6:
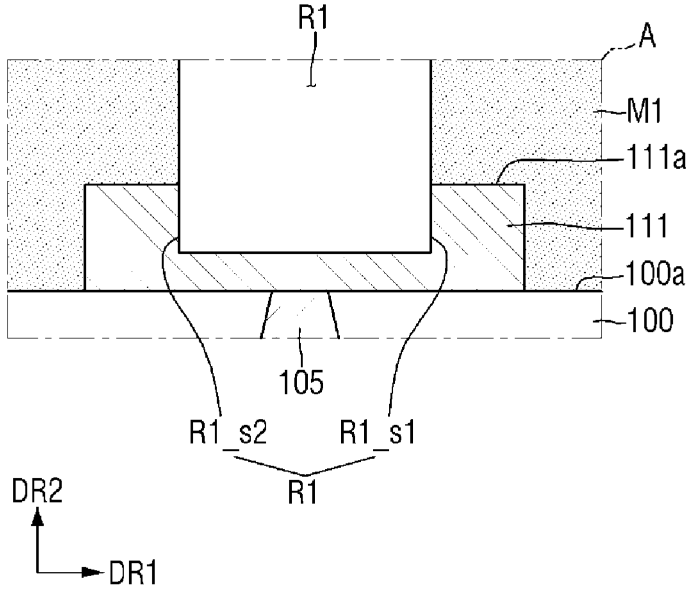

Referring to FIGS. 5 and 6, a first mask pattern M1 may be formed on the upper surface 100*a* of the substrate 100 and the first wiring pad 111. Subsequently, by etching a part of the first wiring pad 111 using the first mask pattern M1 as a mask, the first recess R1 may be formed. A bottom surface of the first recess R1 may be formed inside the first wiring pad 111. That is, the bottom surface of the first recess R1 may be formed between the upper surface 100*a* of the substrate 100 and the upper surface 111*a* of the first wiring pad 111.

Figure 7:
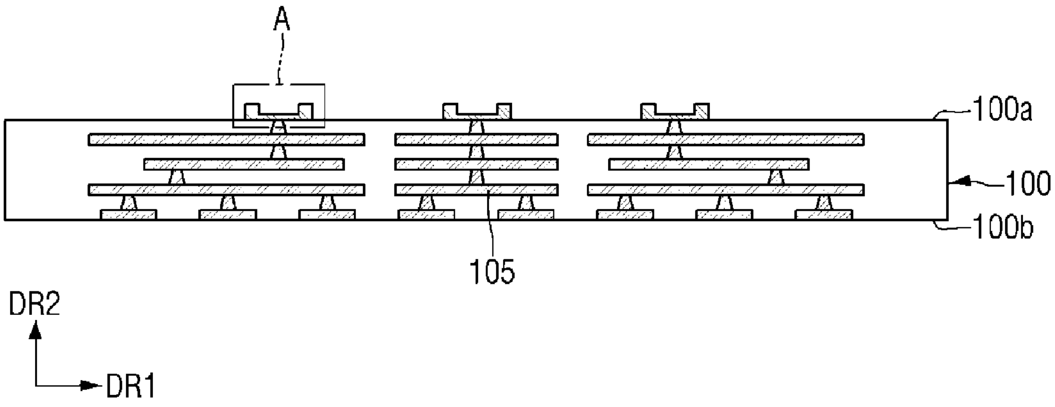
Figure 8:
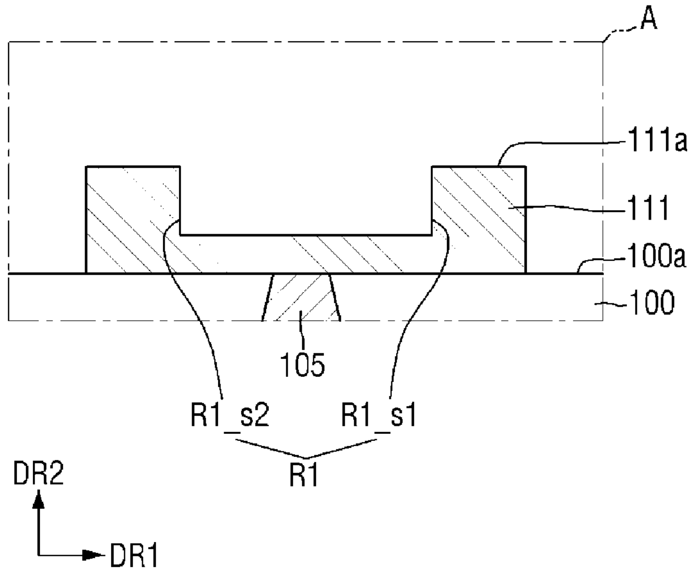

Referring to FIGS. 7 and 8, the first mask pattern M1 may be removed.

Figure 9:
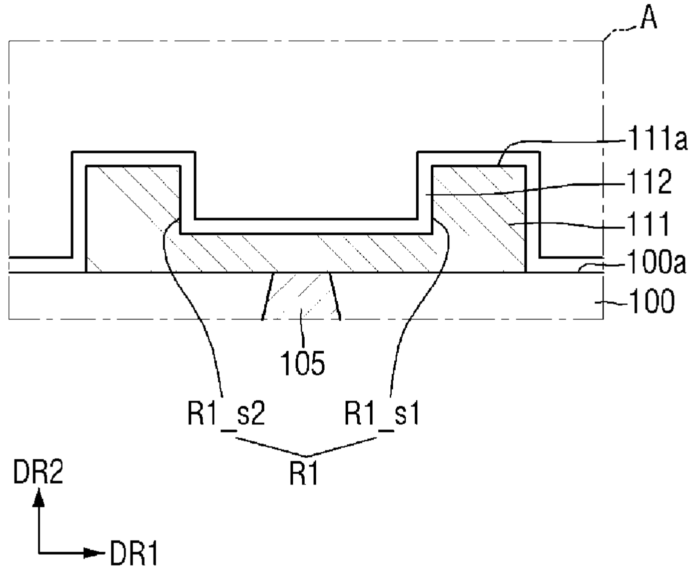

Referring to FIG. 9, the first metal seed layer 112 may be formed on the upper surface 100*a* of the substrate 100, and the sidewalls and the upper surface 111*a* of the first wiring pad 111. Further, the first metal seed layer 112 may be formed on the first sidewall R1_*s*1, the second sidewall R1_*s*2, and the bottom surface of the first recess R1. The first metal seed layer 112 may be formed, for example, conformally. For example, the first metal seed layer 112 may be formed conformally on the first sidewall R1_*s*1, the second sidewall R1_*s*2, and the bottom surface of the first recess R1.

Figure 10:
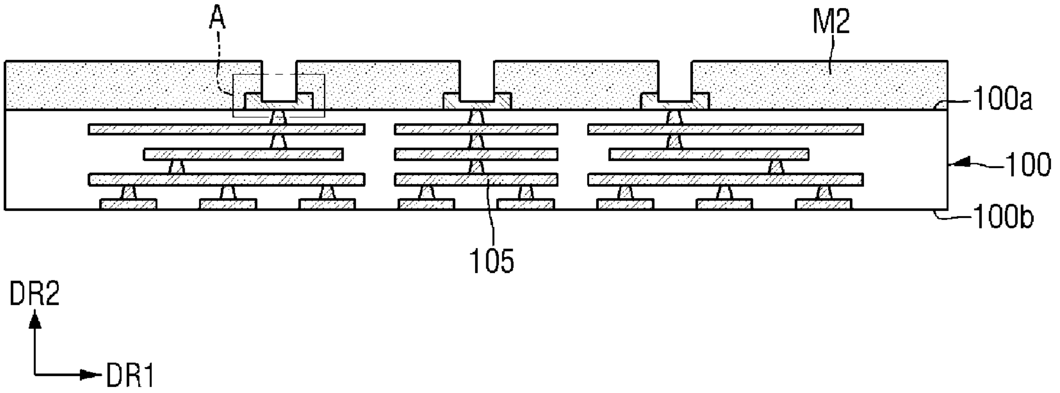
Figure 11:
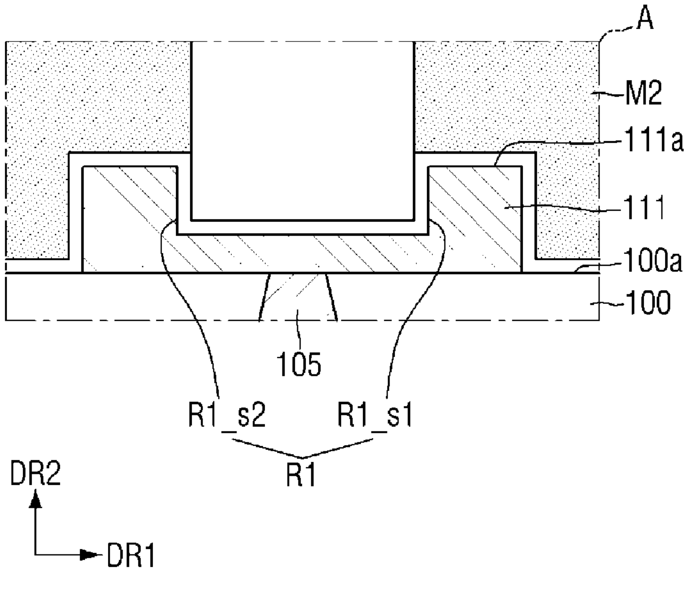

Referring to FIGS. 10 and 11, a second mask pattern M2 may be formed on the first metal seed layer 112. The second mask pattern M2 may expose the first metal seed layer 112 formed on the bottom surface of the first recess R1. The second mask pattern M2 may overlap the first metal seed layer 112 formed on the first sidewall R1_*s*1 of the first recess R1 in the vertical direction DR2. Further, the second mask pattern M2 may overlap the first metal seed layer 112 formed on the second sidewall R1_*s*2 of the first recess R1 in the vertical direction DR2.

Figure 12:
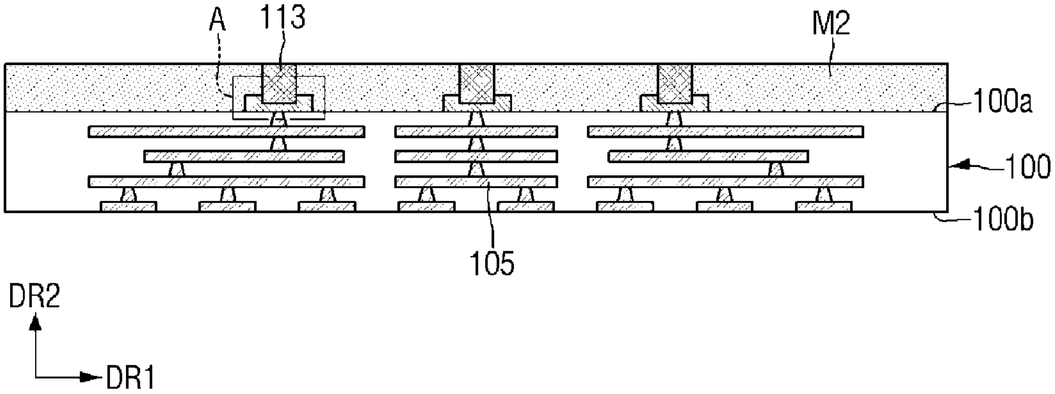
Figure 13:
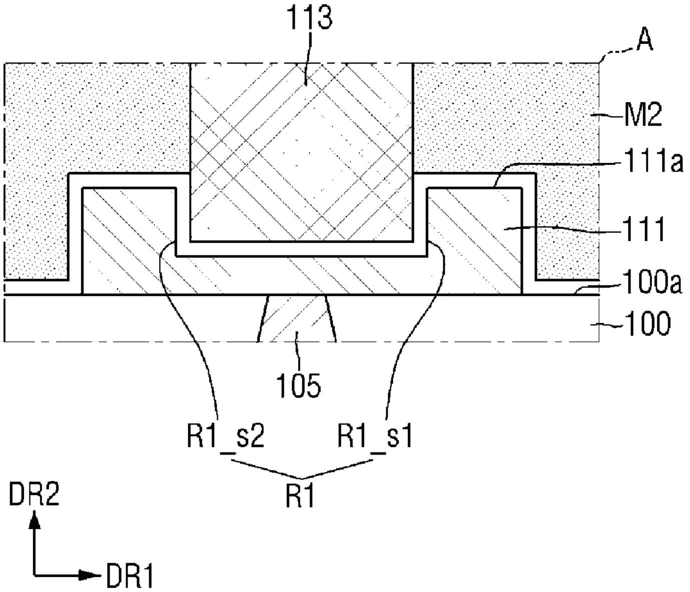

Referring to FIGS. 12 and 13, the first wiring post 113 may be formed on the first metal seed layer 112 inside the first recess R1. The interior of the first recess R1 may be completely filled with the first metal seed layer 112 and the first wiring post 113.

Figure 14:
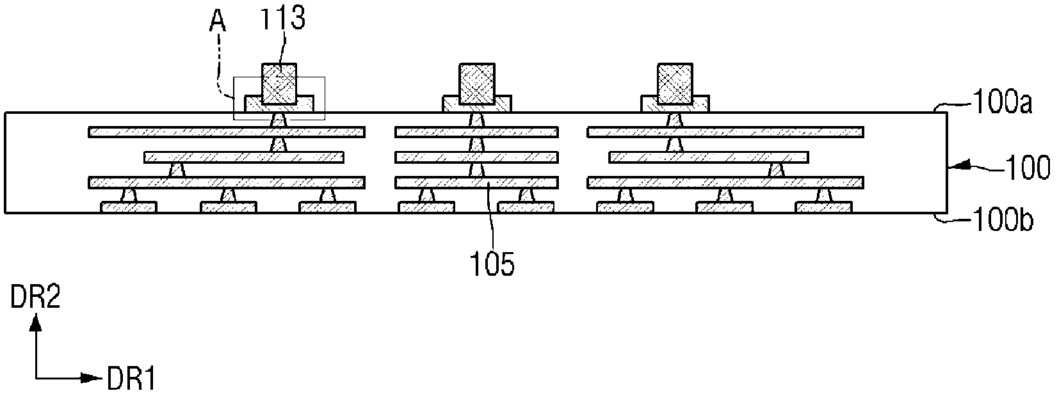
Figure 15:
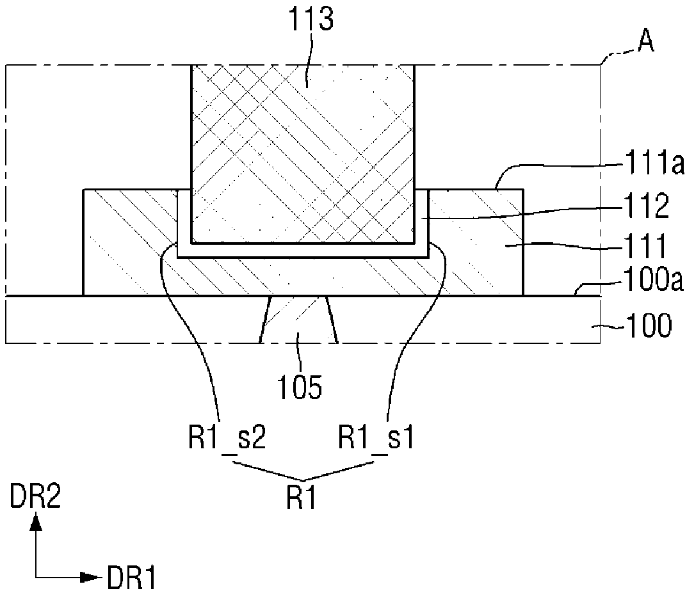

Referring to FIGS. 14 and 15, the second mask pattern M2 may be removed. Therefore, the sidewalls and the upper surface 111*a* of the first wiring pad 111, the uppermost surface of the first metal seed layer 112, and a part of the sidewalls and the upper surface of the first wiring post 113 may be exposed.

Figure 16:
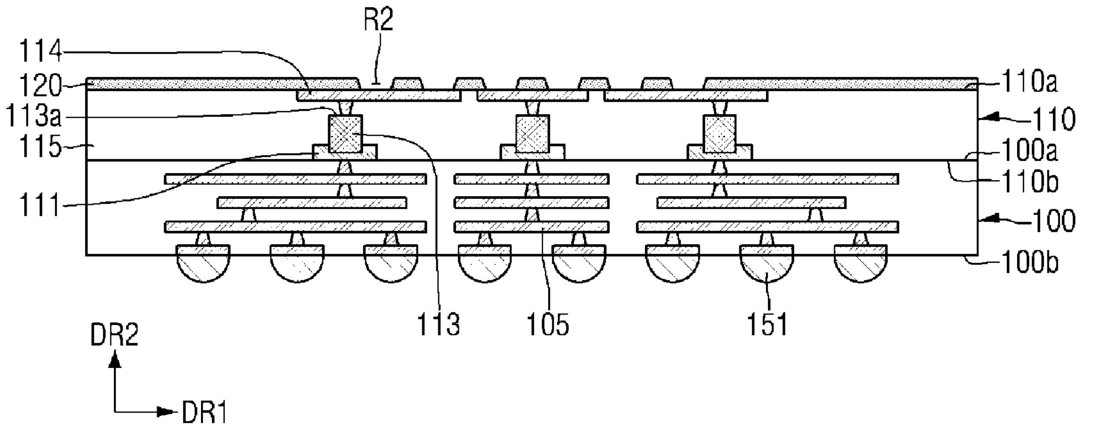

Referring to FIG. 16, the first interlayer insulating film 115 may be formed on the upper surface 100*a* of the substrate 100. The first interlayer insulating film 115 may cover the sidewalls and the upper surface 111*a* of the first wiring pad 111, the uppermost surface of the first metal seed layer 112, and a part of the sidewalls and the upper surface of the first wiring post 113.

Subsequently, the second wiring pattern 114 may be formed on the upper surface 113*a* of the first wiring post 113 inside the first interlayer insulating film 115. The sidewalls of the second wiring pattern 114 may be surrounded by the first interlayer insulating film 115. Through such a fabrication process, the first redistribution layer 110 may be formed on the upper surface 100*a* of the substrate 100.

Subsequently, the first solder resist layer 120 may be formed on the upper surface 110*a* of the first redistribution layer 110. The first solder resist layer 120 may be formed conformally. However, embodiments of the present disclosure are not limited thereto.

Subsequently, the second recess R2 may be formed inside the first solder resist layer 120. The second recess R2 may penetrate the first solder resist layer 120 in the vertical direction DR2. At least a part of the second wiring pattern 114 may be exposed on the bottom surface of the second recess R2.

Referring back to FIG. 1, the first conductive terminal 130 may be formed on the sidewalls and the bottom surface of the second recess R2. Further, at least a part of the first conductive terminal 130 may also be formed on the upper surface of the first solder resist layer 120 adjacent to both sidewalls of the second recess R2.

Subsequently, the first semiconductor chip 140 may be formed on the upper surface of the first solder resist layer 120. The first semiconductor chip 140 may be attached to the first conductive terminal 130 through the second solder ball 152. Next, the first underfill material 160 may be formed to surround the sidewalls of the second solder ball 152 between the upper surface of the first solder resist layer 120 and the first semiconductor chip 140. Subsequently, the first mold layer 170 may be formed on the upper surface of the first solder resist layer 120 to surround the sidewalls of the first underfill material 160, and the sidewalls and the upper surface of the first semiconductor chip 140. The semiconductor package shown in FIG. 1 may be fabricated through such a fabrication process.

Hereinafter, a semiconductor package according to embodiments of the present disclosure will be described with reference to FIG. 17. For convenience of explanation, a further description of components and technical aspects previously described may be omitted, and differences from the semiconductor device shown in FIGS. 1 and 2 will be mainly described.

Figure 17:
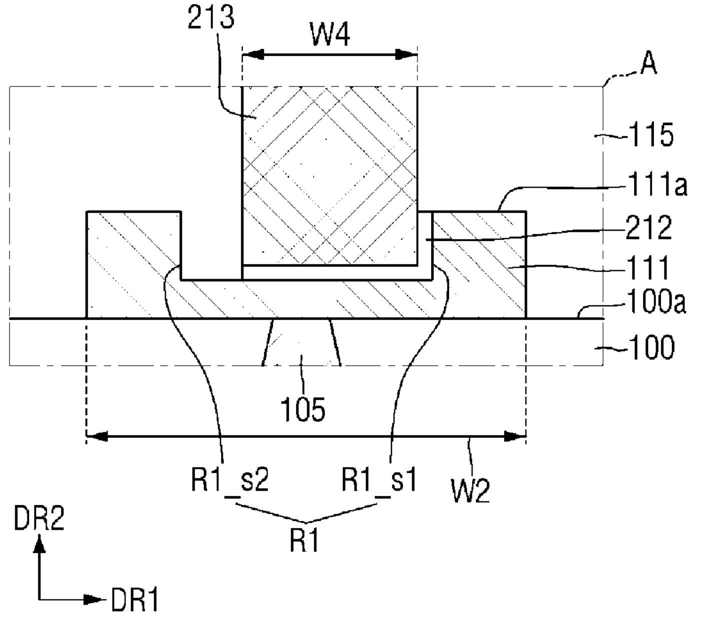
FIG. 17 is an enlarged view of a semiconductor package according to embodiments of the present disclosure.

FIG. 17 is an enlarged view illustrating a semiconductor package according to embodiments of the present disclosure.

Referring to FIG. 17, in the semiconductor package according to embodiments of the present disclosure, each of a first wiring post 213 and a first metal seed layer 212 is not disposed on a part of the bottom surface of the first recess R1.

For example, each of the first wiring post 213 and the first metal seed layer 212 may be spaced apart from the second sidewall R1_*s*2 of the first recess R1. In an embodiment according to FIG. 17, the first metal seed layer 212 is not disposed on the second sidewall R1_*s*2 of the first recess R1 and the bottom surface of the first recess R1 adjacent to the second sidewall R1_*s*2 of the first recess R1. The first interlayer insulating film 115 may be disposed between the second sidewall R1_*s*2 of the first recess R1 and the first wiring post 213. Further, the first interlayer insulating film 115 may be disposed between the second sidewall R1_*s*2 of the first recess R1 and the first metal seed layer 212.

A width W4 of the first wiring post 213 in the horizontal direction DR1 may be smaller than the width W2 of the first wiring pad 111 in the horizontal direction DR1. The width W4 of the first wiring post 213 in the horizontal direction DR1 may be smaller than the width W1 (see FIG. 2) of the first recess R1 in the horizontal direction DR1.

Hereinafter, a semiconductor package according to embodiments of the present disclosure will be described with reference to FIG. 18. Differences from the semiconductor device shown in FIGS. 1 and 2 will be mainly described.

Figure 18:
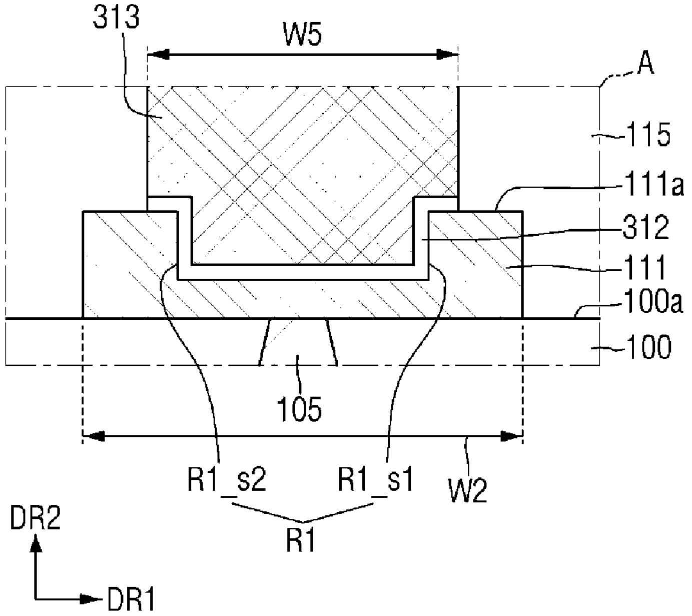
FIG. 18 is an enlarged view illustrating a semiconductor package according to embodiments of the present disclosure.

FIG. 18 is an enlarged view illustrating a semiconductor package according to embodiments of the present disclosure.

Referring to FIG. 18, in the semiconductor package according to embodiments of the present disclosure, each of at least a part of the first metal seed layer 312 and at least a part of the first wiring post 313 may be disposed on the upper surface 111*a* of the first wiring pad 111.

For example, each of at least a part of the first metal seed layer 312 and at least a part of the first wiring post 313 may be disposed on the upper surface 111*a* of the first wiring pad 111 adjacent to the first sidewall R1_*s*1 of the first recess R1. Further, each of at least a part of the first metal seed layer 312 and at least a part of the first wiring post 313 may be disposed on the upper surface 111*a* of the first wiring pad 111 adjacent to the second sidewall R1_*s*2 of the first recess R1.

A width W5 of the first wiring post 313 in the horizontal direction DR1 may be smaller than the width W2 of the first wiring pad 111 in the horizontal direction DR1. The width W5 of the first wiring post 313 in the horizontal direction DR1 may be larger than the width W1 (see FIG. 2) of the first recess R1 in the horizontal direction DR1.

Hereinafter, a semiconductor package according to embodiments of the present disclosure will be described with reference to FIG. 19. For convenience of explanation, a further description of components and technical aspects previously described may be omitted, and differences from the semiconductor device shown in FIGS. 1 and 2 will be mainly described.

Figure 19:
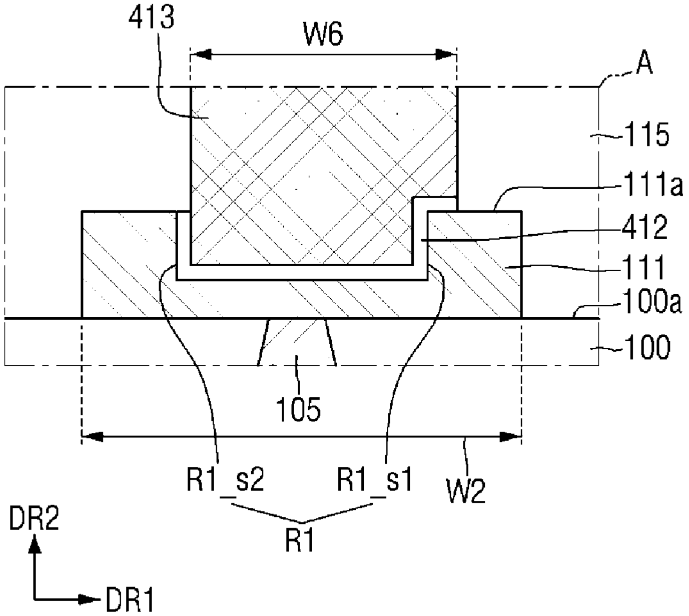
FIG. 19 is an enlarged view illustrating a semiconductor package according to embodiments of the present disclosure.

FIG. 19 is an enlarged view illustrating a semiconductor package according to embodiments of the present disclosure.

Referring to FIG. 19, in the semiconductor package according to embodiments of the present disclosure, each of at least a part of a first metal seed layer 412 and at least a part of a first wiring post 413 may be disposed on the upper surface 111*a* of the first wiring pad 111.

For example, at least a part of the first metal seed layer 412 and at least a part of the first wiring post 413 may each be disposed on the upper surface 111*a* of the first wiring pad 111 adjacent to the first sidewall R1_*s*1 of the first recess R1. An upper surface of the first metal seed layer 412 disposed on the second sidewall R1_*s*2 of the first recess R1 may be in contact with the first interlayer insulating film 115.

A width W6 of the first wiring post 413 in the horizontal direction DR1 may be smaller than the width W2 of the first wiring pad 111 in the horizontal direction DR1. The width W6 of the first wiring post 413 in the horizontal direction DR1 may be larger than the width W1 (see FIG. 2) of the first recess R1 in the horizontal direction DR1. However, embodiments of the present disclosure are not limited thereto. For example, in embodiments, the width W6 of the first wiring post 413 in the horizontal direction DR1 may be smaller than the width W1 (see FIG. 2) of the first recess R1 in the horizontal direction DR1.

Hereinafter, a semiconductor package according to embodiments of the present disclosure will be described with reference to FIG. 20. For convenience of explanation, a further description of components and technical aspects previously described may be omitted, and differences from the semiconductor devices shown in FIGS. 1 and 2 will be mainly described.

Figure 20:
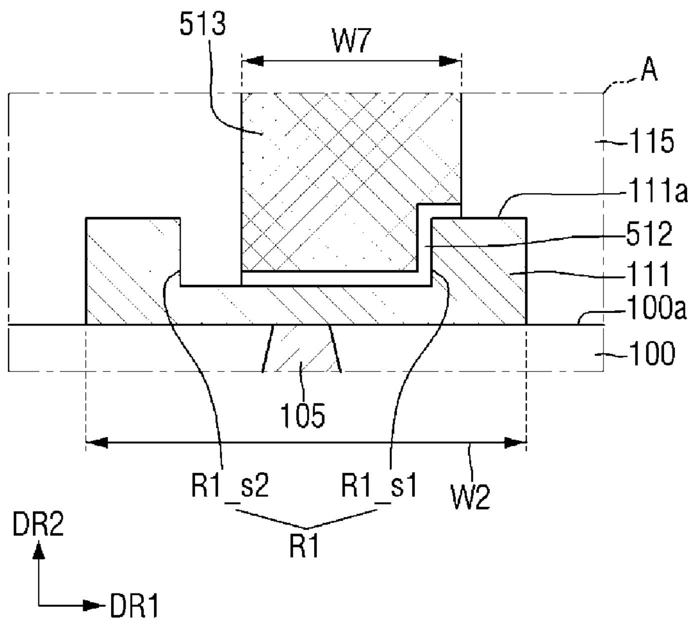
FIG. 20 is an enlarged view illustrating a semiconductor package according to embodiments of the present disclosure.

FIG. 20 is an enlarged view illustrating a semiconductor package according to embodiments of the present disclosure.

Referring to FIG. 20, in the semiconductor package according to embodiments of the present disclosure, each of a first wiring post 513 and a first metal seed layer 512 is not disposed on a part of the bottom surface of the first recess R1. Further, each of at least a part of the first metal seed layer 512 and at least a part of the first wiring post 513 is not disposed on the upper surface 111*a* of the first wiring pad 111.

For example, each of the first wiring post 513 and the first metal seed layer 512 may be spaced apart from the second sidewall R1_*s*2 of the first recess R1. In an embodiment according to FIG. 20, the first metal seed layer 512 is not disposed on the second sidewall R1_*s*2 of the first recess R1 and the bottom surface of the first recess R1 adjacent to the second sidewall R1_*s*2 of the first recess R1. The first interlayer insulating film 115 may be disposed between the second sidewall R1_*s*2 of the first recess R1 and the first wiring post 513. Further, the first interlayer insulating film 115 may be disposed between the second sidewall R1_*s*2 of the first recess R1 and the first metal seed layer 512.

For example, at least a part of the first metal seed layer 512 and at least a part of the first wiring post 513 may each be disposed on the upper surface 111*a* of the first wiring pad 111 that is adjacent to the first sidewall R1_*s*1 of the first recess R1. A width W7 of the first wiring post 513 in the horizontal direction DR1 may be smaller than the width W2 of the first wiring pad 111 in the horizontal direction DR1.

Hereinafter, a semiconductor package according to embodiments of the present disclosure will be described with reference to FIGS. 21 and 22. For convenience of explanation, a further description of components and technical aspects previously described may be omitted, and differences from the semiconductor device shown in FIGS. 1 and 2 will be mainly described.

Figure 21:
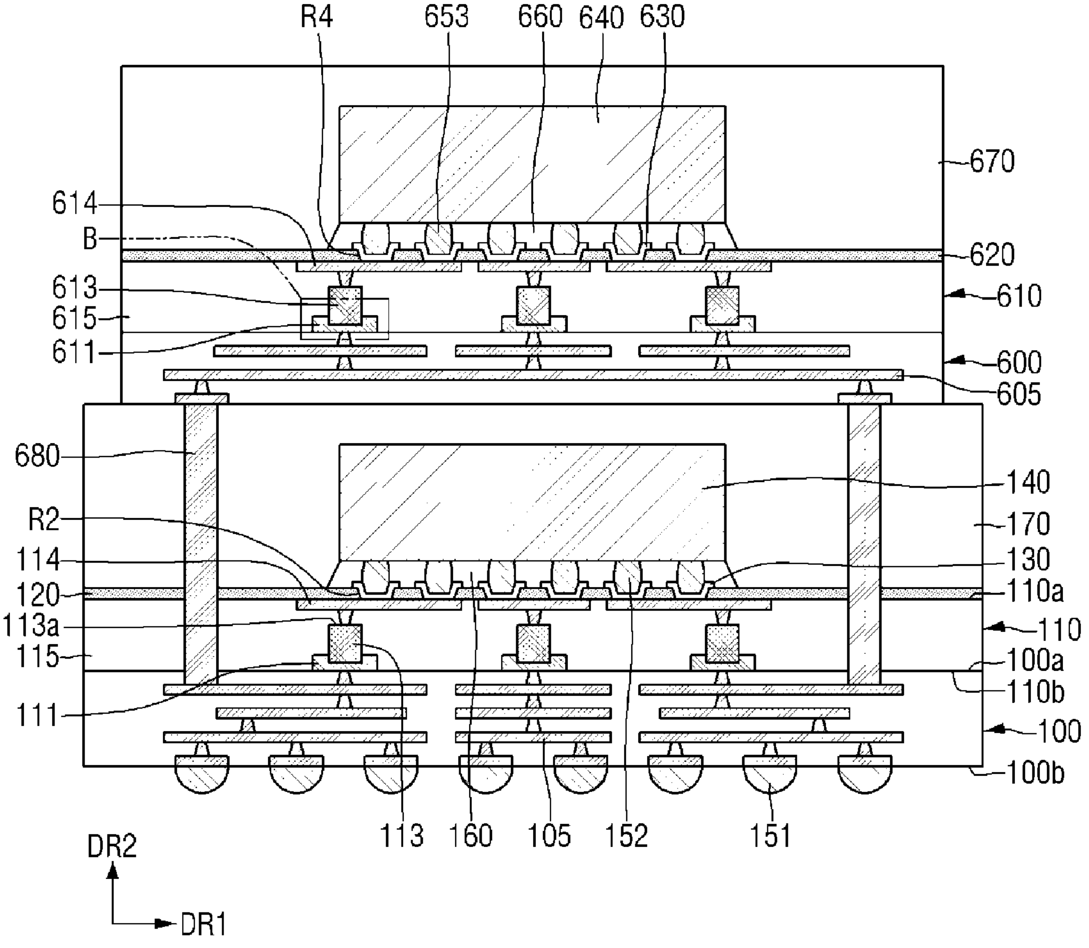
FIG. 21 is a diagram illustrating a semiconductor package according to embodiments of the present disclosure.

FIG. 21 is a diagram illustrating a semiconductor package according to embodiments of the present disclosure. FIG. 22 is an enlarged view of a region B of FIG. 21 according to embodiments of the present disclosure.

Figure 22:
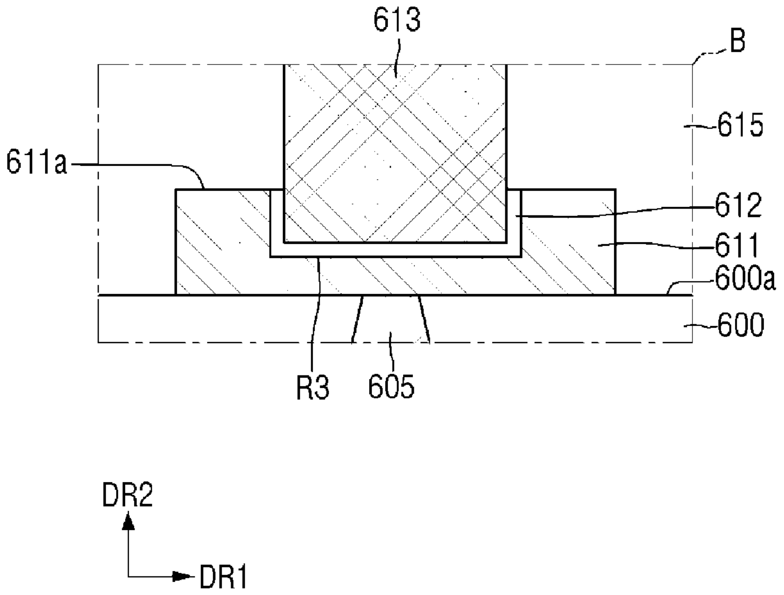
FIG. 22 is an enlarged view of a region B of FIG. 21 according to embodiments of the present disclosure.

Referring to FIGS. 21 and 22, a semiconductor package according to embodiments of the present disclosure further includes an interposer 600, a third wiring pattern 605, a second redistribution layer 610, a second solder resist layer 620, a second conductive terminal 630, a second semiconductor chip 640, a third solder ball 653, a second underfill material 660, a second mold layer 670, and a connecting via 680.

The interposer 600 may be disposed on the first semiconductor chip 140. For example, the interposer 600 may be disposed on the upper surface of the first mold layer 170. The third wiring pattern 605 may be disposed inside the interposer 600. The third wiring pattern 605 may include a plurality of wirings spaced apart from each other in the horizontal direction DR1. Further, the third wiring pattern 605 may include a plurality of wirings spaced apart from each other in the vertical direction DR2. The third wiring pattern 605 may include a conductive material.

The connecting via 680 may be disposed on the sidewalls of the first semiconductor chip 140. The connecting via 680 may penetrate the first mold layer 170, the first solder resist layer 120, and the first redistribution layer 110 in the vertical direction DR2. The connecting via 680 may be electrically directly connected between the first wiring pattern 105 and the third wiring pattern 605. The substrate 100 and the interposer 600 may be electrically connected directly through the connecting via 680. The connecting via 680 may include a conductive material.

The second redistribution layer 610 may be disposed on an upper surface 600*a* of the interposer 600. The second redistribution layer 610 may include a second wiring pad 611, a second metal seed layer 612, a second wiring post 613, a fourth wiring pattern 614, and a second interlayer insulating film 615. The second redistribution layer 610 may have a structure similar to that of the first redistribution layer 110.

For example, the second wiring pad 611 may be disposed on the upper surface 600*a* of the interposer 600. The second wiring pad 611 may be in contact with the third wiring pattern 605. The first recess R1 may be formed inside the first wiring pad 111. The third recess R3 may be recessed from an upper surface 611*a* of the second wiring pad 611 toward the upper surface 600*a* of the interposer 600. A bottom surface of the third recess R3 may be formed inside the second wiring pad 611.

The second metal seed layer 612 may be disposed along both sidewalls and the bottom surface of the third recess R3. The second wiring post 613 may be disposed on the second metal seed layer 612. At least a part of the second wiring post 613 may be disposed inside the third recess R3. The second wiring post 613 may extend in the vertical direction DR2. The second wiring post 613 may be in contact with the second metal seed layer 612 inside the third recess R3.

An upper surface of the second wiring post 613 may be formed to be higher than the upper surface 611*a* of the second wiring pad 611. The upper surface of the second wiring post 613 may be formed to be lower than the upper surface of the second redistribution layer 610. The upper surface of the second wiring post 613 may be formed to be lower than the lower surface of the second solder resist layer 620.

A width of the second wiring post 613 in the horizontal direction DR1 may be smaller than a width of the second wiring pad 611 in the horizontal direction DR1. The width of the second wiring post 613 in the horizontal direction DR1 may be smaller than the width of the third recess R3 in the horizontal direction DR1.

Each of the second wiring pad 611, the second metal seed layer 612, and the second wiring post 613 may include, for example, copper (Cu). In embodiments, each of the second wiring pad 611, the second metal seed layer 612, and the second wiring post 613 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof.

For example, the second wiring pad 611, the second metal seed layer 612, and the second wiring post 613 may each include the same material. For example, each of the second wiring pad 611, the second metal seed layer 612, and the second wiring post 613 may include copper (Cu). In this case, copper (Cu) included in the second metal seed layer 612 may have a finer structure than that of copper (Cu) included in each of the second wiring pad 611 and the second wiring post 613.

The fourth wiring pattern 614 may be disposed on the upper surface of the second wiring post 613. The fourth wiring pattern 614 may include a plurality of wirings spaced apart from each other in the horizontal direction DR1. Further, the fourth wiring pattern 614 may include a plurality of wirings spaced apart from each other in the vertical direction DR2. The fourth wiring pattern 614 may include a conductive material. The second interlayer insulating film 615 may be disposed on the upper surface 600*a* of the interposer 600. The second interlayer insulating film 615 may surround the second wiring pad 611, the second metal seed layer 612, the second wiring post 613, and the fourth wiring pattern 614. The second interlayer insulating film 615 may include an insulating material.

The second solder resist layer 620 may be disposed on the upper surface of the second redistribution layer 610. The second solder resist layer 620 may include, for example, photo solder resist (PSR) ink. The fourth recess R4 may be formed inside the second solder resist layer 620. The second conductive terminal 630 may be disposed along the sidewalls and a bottom surface of the fourth recess R4. Further, at least a part of the second conductive terminal 630 may also be disposed on the upper surface of the second solder resist layer 620 that is adjacent to both sidewalls of the fourth recess R4. The second conductive terminal 630 may include a conductive material.

The third solder ball 653 may be disposed on the second conductive terminal 630. The second semiconductor chip 640 may be disposed on the upper surface of the second solder resist layer 620. The second semiconductor chip 640 may be electrically directly connected to the second redistribution layer 610 through the third solder ball 653. The second underfill material 660 may surround the sidewalls of the third solder ball 653 between the upper surface of the second solder resist layer 620 and the second semiconductor chip 640. The second mold layer 670 may surround the sidewalls of the second underfill material 660, and the sidewalls and the upper surface of the second semiconductor chip 640, on the upper surface of the second solder resist layer 620.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A semiconductor package, comprising:

a substrate including a first wiring pattern;

a first redistribution layer disposed on an upper surface of the substrate in a vertical direction, wherein the first redistribution layer includes a first wiring pad, a first recess formed on an upper surface of the first wiring pad, a first metal seed layer disposed on sidewalls and a bottom surface of the first recess, and a first wiring post at least partially disposed on the first metal seed layer inside the first recess, wherein a width of the first wiring post is smaller than a width of the first recess in a horizontal direction, wherein a width of an entire body of the first wiring post is uniform along the vertical direction and a height of the first wiring post extends above the first wiring pad, wherein a bottom surface of the first metal seed layer contacts the first wiring pad;

a first solder resist layer disposed on an upper surface of the first redistribution layer and including a second recess formed inside the first solder resist layer;

a first conductive terminal disposed on sidewalls and a bottom surface of the second recess;

a first solder ball disposed on the first conductive terminal; and a first semiconductor chip disposed on the first solder resist layer and electrically connected to the first redistribution layer through the first solder ball.

2. The semiconductor package of claim 1, wherein the upper surface of the first wiring post is lower than the upper surface of the first redistribution layer.

3. The semiconductor package of claim 1, wherein the first wiring post is in contact with the first metal seed layer disposed on the sidewalls of the first recess.

4. The semiconductor package of claim 3, wherein the first recess includes a first sidewall and a second sidewall that is opposite to the first sidewall in the horizontal direction, and wherein the first wiring post is in contact with the first metal seed layer disposed on each of the first sidewall of the first recess and the bottom surface of the first recess.

5. The semiconductor package of claim 4, wherein the first wiring post is in contact with the first metal seed layer disposed on the second sidewall of the first recess.

6. The semiconductor package of claim 1, further comprising:

an interposer disposed on the first semiconductor chip and including a second wiring pattern;

a second redistribution layer disposed on an upper surface of the interposer, wherein the second redistribution layer includes a second wiring pad, a third recess formed on an upper surface of the second wiring pad, a second metal seed layer disposed on sidewalls and a bottom surface of the third recess, and a second wiring post at least partially disposed on the second metal seed layer inside the third recess;

a second solder resist layer disposed on an upper surface of the second redistribution layer and including a fourth recess formed inside the second solder resist layer;

a second conductive terminal disposed on sidewalls and a bottom surface of the fourth recess;

a second solder ball disposed on the second conductive terminal; and a second semiconductor chip disposed on the second solder resist layer and electrically connected to the second redistribution layer through the second solder ball.

7. The semiconductor package of claim 1, wherein a width of the first recess in the horizontal direction has a range of about 20 μm to about 100 μm.

8. The semiconductor package of claim 1, wherein a depth of the first recess in the vertical direction has a range of about 0.5 μm to about 10 μm.

9. The semiconductor package of claim 1, wherein a width of the first wiring pad in the horizontal direction has a range of about 35 μm to about 130 μm.

10. The semiconductor package of claim 1, wherein a thickness of the first metal seed layer has a range of about 0.3 μm to about 3 μm.

11. A semiconductor package, comprising:

a substrate including a first wiring pattern;

a wiring pad disposed on an upper surface of the substrate in a vertical direction;

a first recess recessed from an upper surface of the wiring pad toward the upper surface of the substrate;

a metal seed layer disposed on sidewalls and a bottom surface of the first recess, wherein a bottom surface of the metal seed layer contacts the wiring pad;

a wiring post at least partially disposed on the metal seed layer inside the first recess, wherein a width of an entire body of the wiring post is uniform along the vertical direction and a height of the wiring post extends above the wiring pad, wherein a width of the wiring post is smaller than a width of the first recess in a horizontal direction, wherein the wiring post is in contact with the metal seed layer disposed on the sidewalls of the first recess, and the wiring post extends in the vertical direction;

a second wiring pattern disposed on an upper surface of the wiring post, wherein the second wiring pattern is in contact with the wiring post; and a solder resist layer disposed on the second wiring pattern, wherein the upper surface of the wiring post is lower than a lower surface of the solder resist layer.

12. The semiconductor package of claim 11, further comprising:

a second recess formed inside the solder resist layer;

a conductive terminal disposed on sidewalls and a bottom surface of the second recess;

a solder ball disposed on the conductive terminal; and a semiconductor chip disposed on the solder resist layer and electrically connected to the second wiling pattern through the solder ball.

13. The semiconductor package of claim 11, wherein the wiring post is in contact with the metal seed layer disposed on the sidewalls of the first recess.

14. The semiconductor package of claim 11, wherein a width of the first recess in the horizontal direction has a range of about 20 μm to about 100 μm.

15. The semiconductor package of claim 11, wherein a depth of the first recess in the vertical direction has a range of about 0.5 μm to about 10 μm.

16. A semiconductor package, comprising:

a substrate including a first wiring pattern;

a wiring pad disposed on an upper surface of the substrate;

a first recess recessed from an upper surface of the wiring pad toward the upper surface of the substrate in a vertical direction;

a metal seed layer disposed on two sidewalls and a bottom surface of the first recess, wherein a bottom surface of the metal seed layer contacts the wiring pad;

a wiring post at least partially disposed on the metal seed layer inside the first recess, wherein a width of an entire body of the wiring post is uniform along the vertical direction and a height of the wiring post extends above the wiring pad, wherein a width of the wiring post is smaller than a width of the first recess in a horizontal direction, wherein the wiring post is in contact with the metal seed layer disposed on the two sidewalls of the first recess, and the wiring post extends in the vertical direction;

a second wiring pattern disposed on an upper surface of the wiring post, wherein the second wiring pattern is in contact with the wiring post;

a solder resist layer disposed on the second wiring pattern;

a second recess formed inside the solder resist layer;

a conductive terminal disposed on sidewalls and a bottom surface of the second recess;

a first solder ball disposed on a lower surface of the substrate;

a second solder ball disposed on the conductive terminal; and a semiconductor chip disposed on the solder resist layer and electrically connected to the second wiring pattern through the second solder ball, wherein the upper surface of the wiring post is lower than a lower surface of the solder resist layer.

* * * * *